United States Patent
Castro (10) Patent No.: US 9,052,991 B2
(45) Date of Patent: Jun. 9, 2015

(54) SYSTEM AND METHOD FOR AUDIO SAMPLE RATE CONVERSION

(71) Applicant: QUALCOMM Incorporated, San Diego, CA (US)

(72) Inventor: Boaz Castro, Tel Aviv (IL)

(73) Assignee: QUALCOMM Incorporated, San Diego, CA (US)

( * ) Notice: Subject to any disclaimer, the term of this patent is extended or adjusted under 35 U.S.C. 154(b) by 380 days.

(21) Appl. No.: 13/686,895

(22) Filed: Nov. 27, 2012

(65) Prior Publication Data

US 2014/0148932 A1    May 29, 2014

(51) Int. Cl.
| | |
|---|---|
| *G06F 17/00* | (2006.01) |
| *H03H 17/06* | (2006.01) |
| *H03M 7/00* | (2006.01) |
| *G06F 17/17* | (2006.01) |

(52) U.S. Cl.
CPC ........... *G06F 17/00* (2013.01); *H03H 17/0628* (2013.01)

(58) Field of Classification Search
CPC .............................. H03G 3/002; H03G 3/3089
USPC .................................................. 341/122, 123
See application file for complete search history.

(56) References Cited

U.S. PATENT DOCUMENTS

| | | | |
|---|---|---|---|
| 7,103,187 B1 * | 9/2006 | Neuman | ........................ 381/59 |
| 7,778,373 B2 | 8/2010 | Kumar et al. | |
| 7,996,496 B2 | 8/2011 | Haartsen et al. | |
| 7,996,571 B2 | 8/2011 | Salokannel | |
| 8,217,812 B2 | 7/2012 | Wang et al. | |
| 2005/0184889 A1 | 8/2005 | Avantaggiati et al. | |
| 2008/0008281 A1 | 1/2008 | Abrol et al. | |
| 2008/0021946 A1 | 1/2008 | De Buys | |
| 2009/0048696 A1 * | 2/2009 | Butters et al. | ................... 700/94 |
| 2010/0080331 A1 | 4/2010 | Garudadri et al. | |
| 2010/0240345 A1 | 9/2010 | Karrman et al. | |
| 2010/0313739 A1 * | 12/2010 | Lupini et al. | ................... 84/611 |
| 2011/0059769 A1 | 3/2011 | Brunolli | |
| 2012/0044062 A1 | 2/2012 | Jersa et al. | |

FOREIGN PATENT DOCUMENTS

WO        WO 9215150 A1 *   9/1992   ............. H03H 17/02

OTHER PUBLICATIONS

International Search Report and Written Opinion—PCT/US2013/071612—ISA/EPO—May 2, 2014.

* cited by examiner

*Primary Examiner* — Curtis Kuntz
*Assistant Examiner* — Thomas Maung (57) ABSTRACT

A method for audio sample rate conversion may include receiving an audio signal at a first rate, the audio signal having a fundamental frequency, determining absolute derivatives of the audio signal at the first rate, and generating a weighted sum of the absolute derivatives to arrive at a combined absolute derivative. The combined absolute derivative may be analyzed to locate a local minimum of the combined absolute derivative, a location in the audio signal may be selected based on the local minimum of the combined absolute derivative and at least one audio sample in the audio signal may be altered at the selected location to develop an audio signal at a second rate.

36 Claims, 6 Drawing Sheets

SYSTEM AND METHOD FOR AUDIO SAMPLE RATE CONVERSION

DESCRIPTION OF THE RELATED ART

The transfer of audio signals between electronic devices is becoming more and more prevalent. Examples of such audio signal transfer include, but are not limited to, Bluetooth communication, music played from a wireless device through a wireless headset, and others. The electronic devices typically each have an audio oscillator that generates an audio frequency to control and synchronize the audio transfer. The audio frequency (also referred to as the audio sample rate) is typically one or more orders of magnitude lower than the frequency of the audio oscillator. When transferring an audio signal between two devices, the audio signal sample rate on both devices would ideally be the same resulting in no audio distortion and good sound quality at the playing device. In practice, it is likely that the two devices will have a sampling rate that is based on slightly different oscillator clocks, resulting in a mismatch in the signal processing between the two devices. When there is variation in the oscillator clocks between the two devices, sample rate conversion (SRC) is used to compensate for sample rate error and to minimize audio signal distortion. Typically, a sample rate conversion is performed to minimize or eliminate the mismatch. This process is generally referred to as audio resampling.

Figure 1:
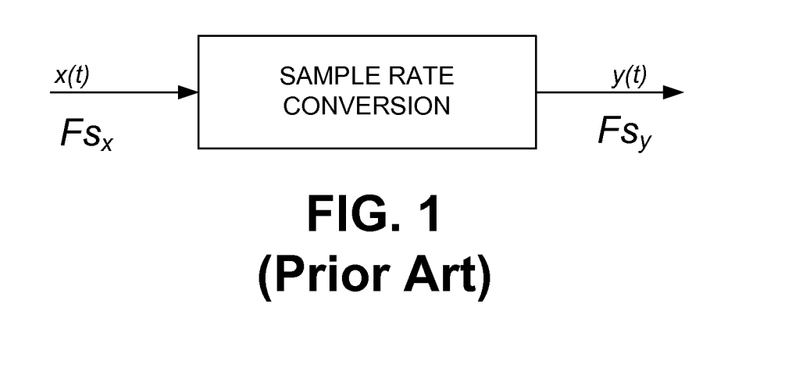
FIG. 1 is a schematic diagram illustrating an audio sample rate conversion.

FIG. 1 shows a block diagram of sample rate conversion. The input signal, x(t), is at sampling rate $Fs_x$ and the output signal, y(t), is at sampling rate $Fs_y$, where $Fs_y = Fs_x +/- \Delta f$ and $\Delta f > 0$.

Sample rate mismatch can be caused by oscillators or crystals having tolerance in their nominal frequency. For example if $Fs_x = 44100$ Hz and $Fs_y = 44093$ Hz, therefore $\Delta f = 7$ Hz leading to a difference of 7 samples per second between the two sampling rates.

In the above example, the frequency mismatch ($\Delta f$) is rather small (a very few samples at a relatively high frequency) and leads to a resampling ratio close to 1, thus leading to very large interpolation and decimation factors being required to perform sample rate conversion.

One way to implement SRC is to use linear time domain interpolation followed by decimation. Time domain interpolation leads to aliasing levels that produce audible distortion and require very long low pass filters (especially for high factor interpolation in the above example) which are computationally expensive.

For a known small mismatch factor, several audio samples can be added or dropped to achieve the desired sampling rate. However, simply dropping/adding samples usually produces audible distortion.

Another existing approach, which can mitigate the simple drop/add audible distortion, is to add or drop samples in a region or regions of the audio signal having low energy (i.e., in regions of the audio signal having only noise). However dropping or adding samples, even in noise only regions of the signal, produces audible distortion especially in high quality music such as piano, etc.

Therefore, it would be desirable to have a system and method for audio sample rate conversion that overcomes the above-mentioned limitations.

SUMMARY

An embodiment of a method for audio sample rate conversion comprises receiving an audio signal at a first rate, the audio signal having a fundamental frequency, determining absolute derivatives of the audio signal at the first rate, and generating a weighted sum of the absolute derivatives to arrive at a combined absolute derivative. The combined absolute derivative is analyzed to locate a local minimum of the combined absolute derivative, a location in the audio signal is selected based on the local minimum of the combined absolute derivative and at least one audio sample in the audio signal is altered at the selected location to develop an audio signal at a second rate.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the term "altering" one or more audio samples refers to adding, dropping or a combination of adding and dropping one or more audio samples in an audio signal.

As used herein, the term "location" in an audio stream or audio signal, and the term "point" in an audio stream or audio signal, refers to a general approximation of such place or places in an audio signal or audio stream where the subject one or more audio sample is altered.

As used herein, the term "absolute derivative" means the absolute value of the derivative regardless of whether the value of the derivative is positive or negative.

Audio sample rate conversion by altering a sample at a location defined by a weighted sum of absolute derivatives overcomes the above-mentioned limitations by altering a sample at or near a location in the audio signal having a relatively low weighted sum of absolute derivatives (also referred to as a local minimum of the weighted sum of absolute derivatives). A generic formula for the derivative of the audio signal is given by $dx(t)=x(t)-x(t-1)$, where t is a discrete time index. In the same manner, the order N of derivative can be calculated according to $d^N x(t)=x^{(N-1)}(t)-x^{(N-1)}(t-1)$.

Although any number of derivatives can work, the use of one or more higher order derivatives results in the local minimum being at a location in the audio signal where the altering of a sample would likely have less audible impact. In other words, the local minimum obtained by using a weighted sum of absolute derivative values is typically located at a smoother point in the signal as the derivative order becomes higher. The term "smooth" refers to a portion of the audio signal that varies in amplitude to a lesser extent over a period of time than does than another portion of the audio signal.

Adding and/or dropping audio samples at locations of the subject audio signal where the weighted sum of the absolute value of several derivatives is lowest or near lowest introduces fewer artifacts than adding/dropping samples arbitrarily or only in noise regions of the audio signal. Adding or dropping audio samples at a location in the audio signal where the weighted sum of the absolute value of several derivatives is lowest or near lowest provides superior audio performance at low cost due to the low processing power needed (e.g., low MIPS when compared to analyzing the fundamental signal). The weighted sum of the absolute value of derivatives can include the case of using only one derivative by setting all other weights to zero, thereby allowing the use of one derivative. While altering at least one sample at a local minimum of the weighted sum of the absolute derivatives might provide an optimal solution, it is also possible to alter at a location other than the local minimum of the weighted sum of the absolute derivatives, assuming that the position at which the sample is altered is at a smooth portion of the audio signal.

In accordance with an embodiment, adding/dropping samples in the area of the signal where the signal is relatively smooth results in little or no audible evidence of the signal alteration. The ideal location in the audio signal to alter a sample can be determined to be a local minimum of the weighted sum of absolute derivatives of the audio signal. The maximum derivative order is a variable parameter and can be set by a user and can vary from one to three or more derivatives. However, there is a tradeoff between processing power consumption and result of audible detection of the altered sample. Altering, the sample at the local minimum of the weighted sum of absolute derivative values introduces fewer artifacts than simply adding/dropping samples arbitrarily. Therefore, altering the sample at the local minimum of the weighted sum of absolute derivative values provides superior audio performance at low processing cost.

Figure 2:
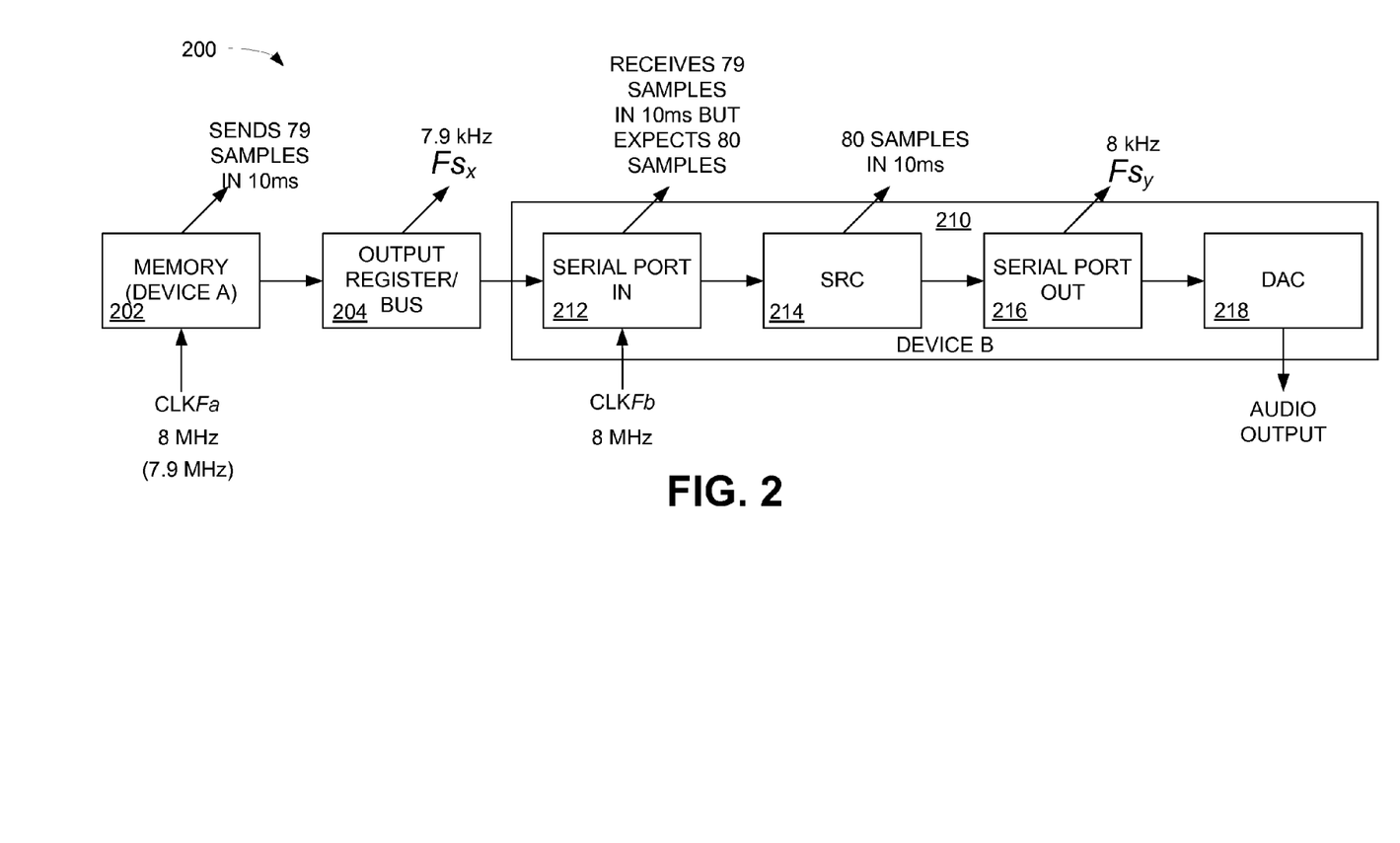
FIG. 2 is a schematic diagram illustrating a system for audio sample rate conversion by altering a sample at a location defined by a weighted sum of absolute derivatives.

FIG. 2 is a functional block diagram illustrating a system 200 for audio sample rate conversion by altering a sample at a location defined by a weighted sum of absolute derivatives. Stated another way, the system 200 is used to analyze an audio signal to locate a local minimum of a signal using the weighted sum of absolute derivative values of the original audio signal to locate the position in the original audio signal at which to alter a sample. Altering the audio signal at a location at or near the local minimum of the weighted sum of absolute derivatives results in a virtually inaudible manipulation of the audio signal, and allows the rate at the output of the SRC to match a rate at an input of the SRC.

The system 200 describes audio sample rate conversion between two devices while transmitting audio from device A to device B and playing the audio signal using the device B as the output device. In this example, the mismatch in oscillator rate is exaggerated to aid in illustrating the system and method for audio sample rate conversion.

A first device (memory device A) 202 produces and sends an audio signal at a first rate. In this example, the first device 202 has a clock frequency of 8 MHz, but, due to impairments and tolerances, actually operates at a frequency of 7.9 MHz. Therefore, the first device 202 produces an audio signal that provides 79 samples in 10 milliseconds (ms). An output register 204 receives the samples from the first device 202.

A second device (device B) 210 comprises a serial input port 212, a sample rate conversion element 214, a serial output port 216 and a digital-to-analog converter (DAC) 218 that provides an analog audio output.

The oscillator clock rates of the first device 202 and the second device 210 are given by: CLKFa=7.9 MHz and CLKFb=8 MHz, respectively. Although the oscillator clock rate of the first device 202 is set to 8 MHz, in this example, it operates at 7.9 MHz, resulting in an audio rate mismatch between the audio signal provided by the first device (memory device A) 202 and the expected rate of the audio signal received at the second device 210.

The first device 202 produces samples, which can be read from a file or a memory, and sends them as an audio signal from the output register 204 to the serial input port 212 of the second device 210, sample by sample at a rate $Fs_x$ of 7900 Hz (7.9 kHz).

The serial input port 212 and the serial output port 216 operate in an auto-buffering mode having a buffer length of 80, so that the time that the second device 210 switches between buffers is $80/8000=1/100[sec]=10$ ms.

Because the oscillator in the first device 202 is slower than the oscillator in the second device 210, in the 10 ms that the second device 210 plays 80 samples through the serial output port 216 and the DAC 218, the second device 210 expects to receive 80 new samples from the first device 202. However, in this example, the first device 202 sends only 79 new samples every 10 ms so the difference in oscillator rates between the first device 202 and the second device 210 causes a sampling rate mismatch. In this example, for every 10 ms the second device 210 receives one fewer sample to play than it expects. This condition is referred to as buffer starvation.

To overcome the sampling rate mismatch, the SRC 214 in the second device 210 attempts to convert the sampling rate from 7.9 kHz at the serial input port 212 to 8 kHz, (Fs$_y$), at the serial output port 216. Therefore, in this example where the oscillator in the first device 202 is slower than the oscillator in the second device 210, the SRC adds one (1) sample for each 10 ms at the local minimum of the weighted sum of absolute derivatives of the audio signal received by the serial input port 212.

Assume a real audio input signal is given by x(k), where k is a time index of the audio input signal. A simple delay function applied to the audio input signal x(k), yields the function y(k)=x(k−1). A first way to define the Nth order derivative of the audio input signal x(k) is $x^{(N)}(k)=0.5*(x^{(N-1)}(k)-x^{(N-1)}(k-1))+0.5*(x^{(N-1)}(k)-x^{(N-1)}(k+1))$. This definition provides an Nth order derivative computation that covers the signal changing in both directions (i.e., past and future samples from a given location). The 0.5 term denotes the average (mean) of both derivatives: the transition from the previous sample to the current sample, k, (x(k)−x(k−1)); and the transition from the current sample, k, to the next sample k+1 (x(k)−x(k+1)).

Alternatively, a second Nth order derivative definition which considers only past samples can be used and is given by $x^{(N)}(k)=x^{(N-1)}(k-1)$. It is noted that other definitions of the derivative are also possible. For simplicity in the rest of this description, the second definition is used unless noted otherwise.

Each absolute derivative has a corresponding weighting factor, $w_1, w_2, w_{N-1}, w_N$, applied to it and the weighted sum of the total of all of the derivatives is calculated and represented by $D_w(k)$. The variable term MinDw refers to a tracer that searches for the local minimum of the weighted sum of the absolute derivatives $D_w(k)$ over a frame. As used herein, the term "tracer" refers to a variable memory buffer that finds the minimum value within a frame, where in this example a frame is 79 samples. The term "m" represents a counter indexing the sample index in each frame of the audio input signal x(k). The variable term Idx_min represents a global time index corresponding to the location of the local minimum of the combined absolute derivative signal, $D_w(k)$ at which a sample is altered. The combined absolute derivative signal, $D_w(k)$ is stored in a variable buffer location. The term k_min is defined as the position of the local minimum of the weighted sum of the absolute derivatives, $D_w(k)$.

When using the first definition of the Nth order derivative to determine the location at which to alter a sample, due to the derivative occurring in both directions from the subject sample, the optimal location to alter a sample is the position defined by k_min.

However, if the Nth order derivative definition is given by $x^{(N)}(k)=x^{(N-1)}(k)-x^{(N-1)}(k-1)$, then the optimal location to alter is less clear because future samples (samples >k) are not considered in the calculation of the combined absolute derivative signal, $D_w(k)$. Therefore, in this instance, a correction of the position of the local minimum is used. The assumed optimal location to alter is therefore given by (k_min−N/2) for odd values of N, and (k_min−(N+1)/2) for even values of N.

The range over which a sample can be altered can depend on the order of the derivative. For example, when using $x^{(N)}(k)=0.5*(x^{(N-1)}(k)-x^{(N-1)}(k-1))+0.5*(x^{(N-1)}(k)-x^{(N-1)}(k+1))$ to define the Nth order derivative, if the derivative order used is six (6), then the value of the weighted sum of the total of all of the derivatives, $D_w(k)$, is a function of seven (7) samples, and it can be assumed that the sample to be altered can be located up to three (3) samples from the location, k, of the local minimum and still be in a region sufficiently smooth to reflect little or no audible evidence of the signal alteration.

The position of the sample to be altered is generally near the local minimum of the weighted sum of the absolute derivatives and can be within a number of samples of the sample at the local minimum of the weighted sum of the absolute derivatives that is less than the order number of the absolute derivatives.

Figure 3:
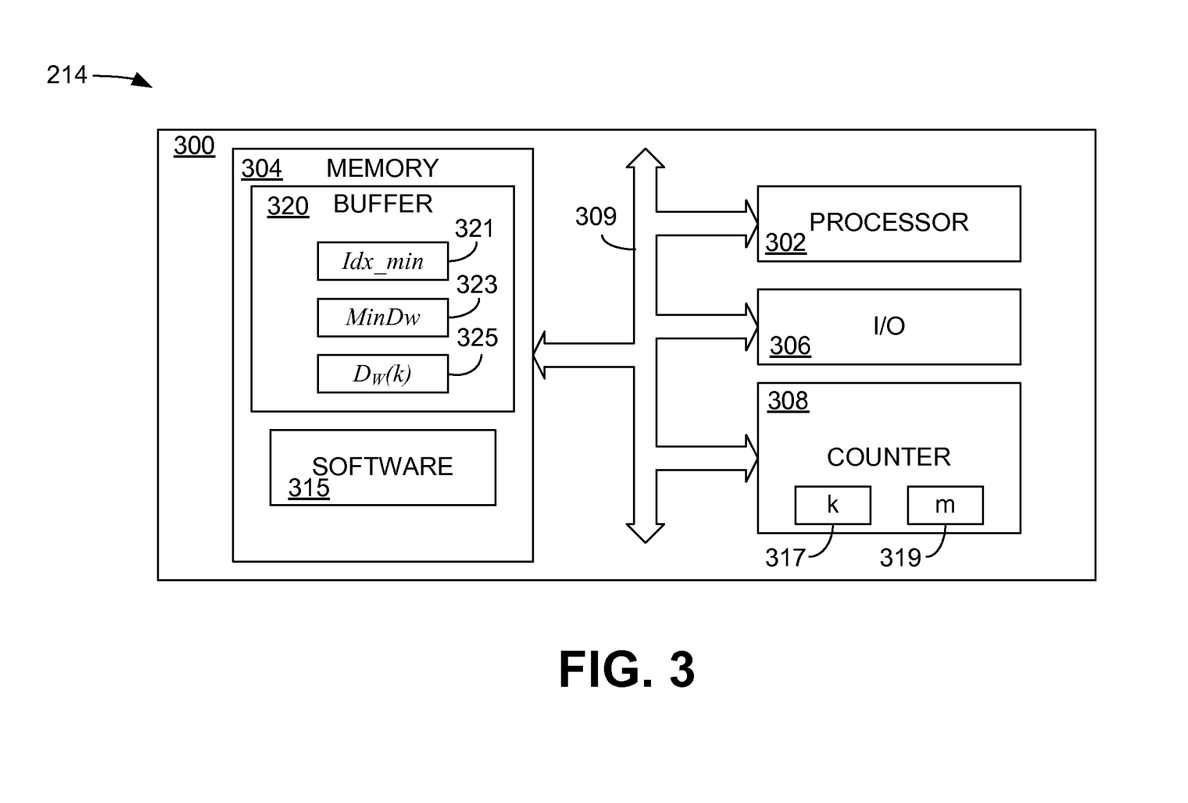
FIG. 3 is a functional block diagram of an embodiment of the sample rate converter of FIG. 2.

FIG. 3 is a functional block diagram of one possible embodiment of the sample rate converter 214 of FIG. 2. The sample rate conversion element 300 is represented in FIG. 3 as a generic processing element that can be located within the second device 210 (device B), outside of the second device 210, or otherwise operatively coupled to the second device 210. The sample rate conversion element 300 can be implemented using any of a number of different methodologies, structures, elements and logic. For example, the sample rate conversion element 300 can be implemented on a general purpose or special purpose computing device, on a digital signal processor (DSP), on a dedicated audio chip, or on any other processing device associated with the second device 210.

In an embodiment, the sample rate conversion element 300 comprises a processor 302, a memory 304, an input/output (I/O) element 306, a counter 308 and a software element 315, operatively coupled together over a communication bus 309. The communication bus 309 can be any physical and/or logical communication infrastructure that allows the connected elements to communicate and interoperate. The software element 315 comprises the logic and instructions for execution by the processor 302 for performing the audio sample rate conversion described herein. The memory 304 can comprise volatile memory, non-volatile memory, or a combination of volatile and non-volatile memory, and can store various instructions to be executed by the processor 302. In an embodiment, the counter 308 comprises a field 317 for maintaining a counter for the value of the term "k", and a field 319 for maintaining a counter for the value of the term "m" which represents the sample index in each frame of the audio input signal x(k). The memory 304 also comprises a buffer 320 having a memory location 321 for the term Idx_min, which refers to a global time index corresponding to the location of the local minimum of the combined absolute derivative signal, $D_w(k)$ at or near which point a sample is altered, a memory location 323 for the term MinDw and a memory location 325 for the term $D_w(k)$.

Figure 4:
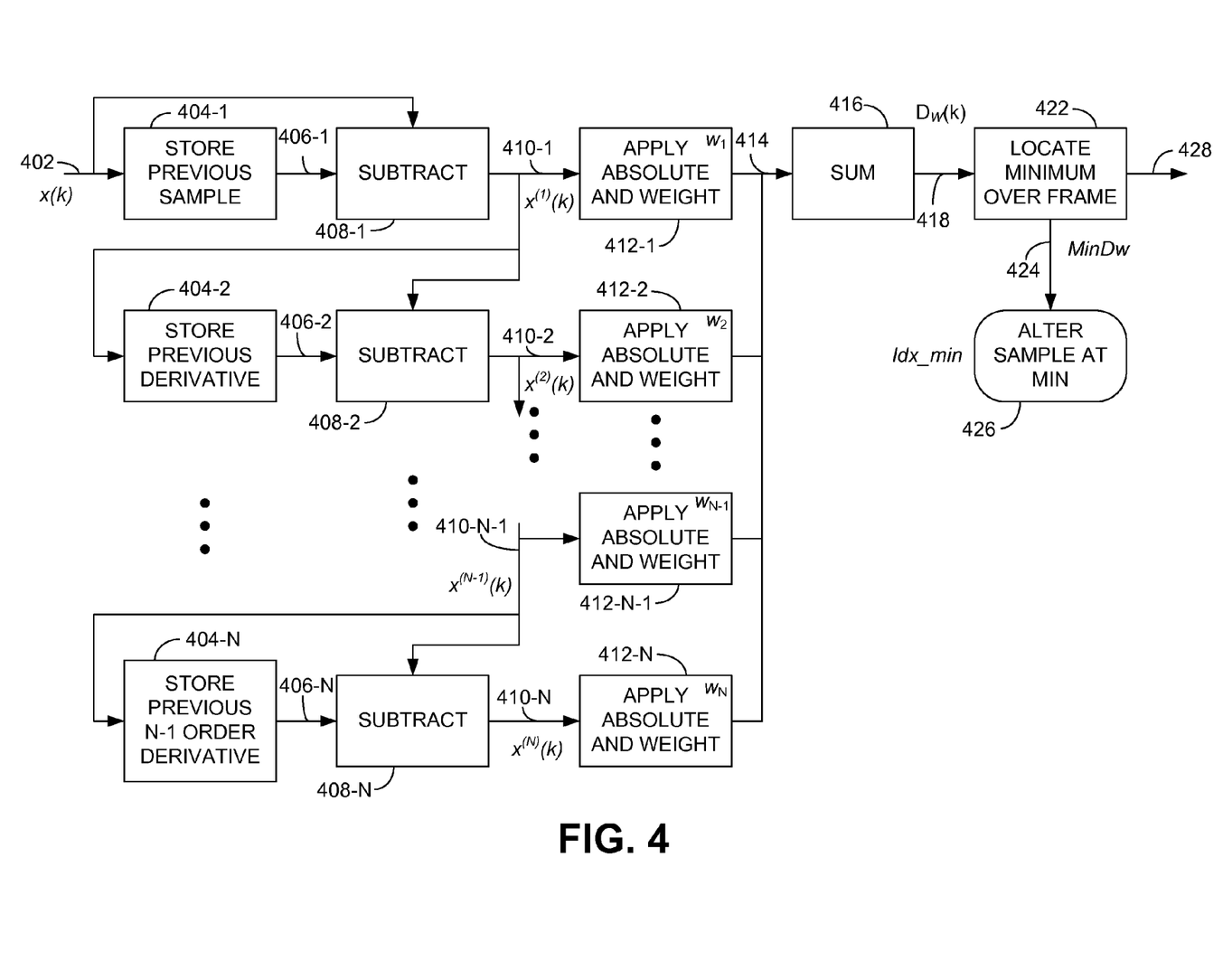
FIG. 4 is another functional block diagram illustrating an embodiment of the sample rate converter of FIG. 2.

FIG. 4 is another functional block diagram illustrating an embodiment of the sample rate converter of FIG. 2. The elements shown in FIG. 4 are functional descriptions of elements and steps that can occur in and be performed by the sample rate conversion element 300 of FIG. 3.

The sample rate conversion element 400 comprises audio sample/derivatives storage elements 404, referred to as 404-1 through 404-N, where N refers to the order of the derivative of the audio input signal x(k) on connection 402 being processed. The sample rate conversion element 400 also comprises subtraction elements 408, referred to as subtraction elements 408-1 through 408-N, absolute value and weighting elements 412, referred to as 412-1 through 412-N, a summation element 416, and a local minimum determination element 422.

An audio input signal x(k) is provided over connection 402 to the storage element 404-1. The storage element 404-1 stores a previous audio sample, and provides the stored previous audio sample over connection 406-1 to the subtraction element 408-1. The subtraction element 408-1 also receives the audio input signal x(k) over connection 402. The subtraction element 408-1 subtracts the previously stored audio sample from the current audio input sample and provides the first order derivative $x^{(1)}(k)$ on connection 410-1. The first order derivative $x^{(1)}(k)$ is applied to the absolute value and weighting element 412-1, which computes the absolute value of the first order derivative signal on connection 410-1, and applies a weighting factor, $w_1$, to the first order derivative signal on connection 410-1. The weighting factor, w can be user selectable and each of the derivatives can be weighted the same or differently. The output of the absolute value and weighting element 412-1 is provided on connection 414 to a summation element 416.

The first order derivative $x^{(1)}(k)$ on connection 410-1 is also provided to the storage element 404-2 and to the subtraction element 408-2. The storage element 404-2 stores the first order derivative $x^{(1)}(k)$ as a previous value and provides the stored value on connection 406-2 to the subtraction element 408-2. The subtraction element 408-2 provides a second order derivative $x^{(2)}(k)$ of the audio input signal $x(k)$ on connection 410-2. The second order derivative $x^{(2)}(k)$ on connection 410-2 is applied to the absolute value and weighting element 412-2, which computes the absolute value of the second order derivative $x^{(2)}(k)$ on connection 410-2 and applies a weighting factor $w_2$. The output of the absolute value and weighting element 412-2 is provided on connection 414 to the summation element 416.

Similar to the above description, the N-1 order derivative of the audio input signal $x(k)$ on connection 402 is similarly computed and provided from connection 410-N-1 to the absolute value and weighting element 412-N-1, to the storage element 404-N and to the subtraction element 408-N. The Nth order derivative $x^{(N)}(k)$ on connection 410-N is applied to the absolute value and weighting element 412-N, which computes the absolute value of the Nth order derivative $x^{(N)}(k)$ on connection 410-N and applies a weighting factor $w_N$. The output of the absolute value and weighting element 412-N is provided on connection 414 to the summation element 416.

The summation element 416 sums all of the absolute values of the derivatives and provides the combined absolute derivative signal, $D_w(k)$, on connection 418 to the computation element 422. The computation element 422 operates on the combined absolute derivative signal, $D_w(k)$, to locate the local minimum of the combined absolute derivative. The term MinDw is a tracer that searches for the minimum location (stored in buffer location 321, as Idx_min) of the combined absolute derivative signal, $D_w(k)$, over a frame which in this example, has 79 samples. The term Idx_min is a variable buffer location 321 that refers to a location in a global time index of the audio input signal. The value of the term Idx_min is a variable that is set to the value of the local minimum using the counter value k, 317. The term Idx_min also corresponds to the location of the local minimum of the combined absolute derivative signal, $D_w(k)$ at or near which a sample is altered.

The variable term MinDw is provided to a sample alteration element 426, which adds or drops a sample at or near the local minimum of the combined absolute derivative signal provided by the computation element 422. A corrected audio output stream is provided over connection 428.

In an embodiment, the function of the storage elements 404 can be provided by the memory 304 (FIG. 3), the function of the subtraction elements 408 can be provided by the processor 302 (FIG. 3), the function of the absolute value and weighting elements 412 can be performed by the processor 302 and memory 304 (FIG. 3), the function of the summation element 416 can be performed by the processor 302 (FIG. 3), the function of the computation element 422 can be performed by the processor 302 (FIG. 3) and the function of the sample alteration element 426 can be performed by the processor 302 (FIG. 3).

Figure 5:
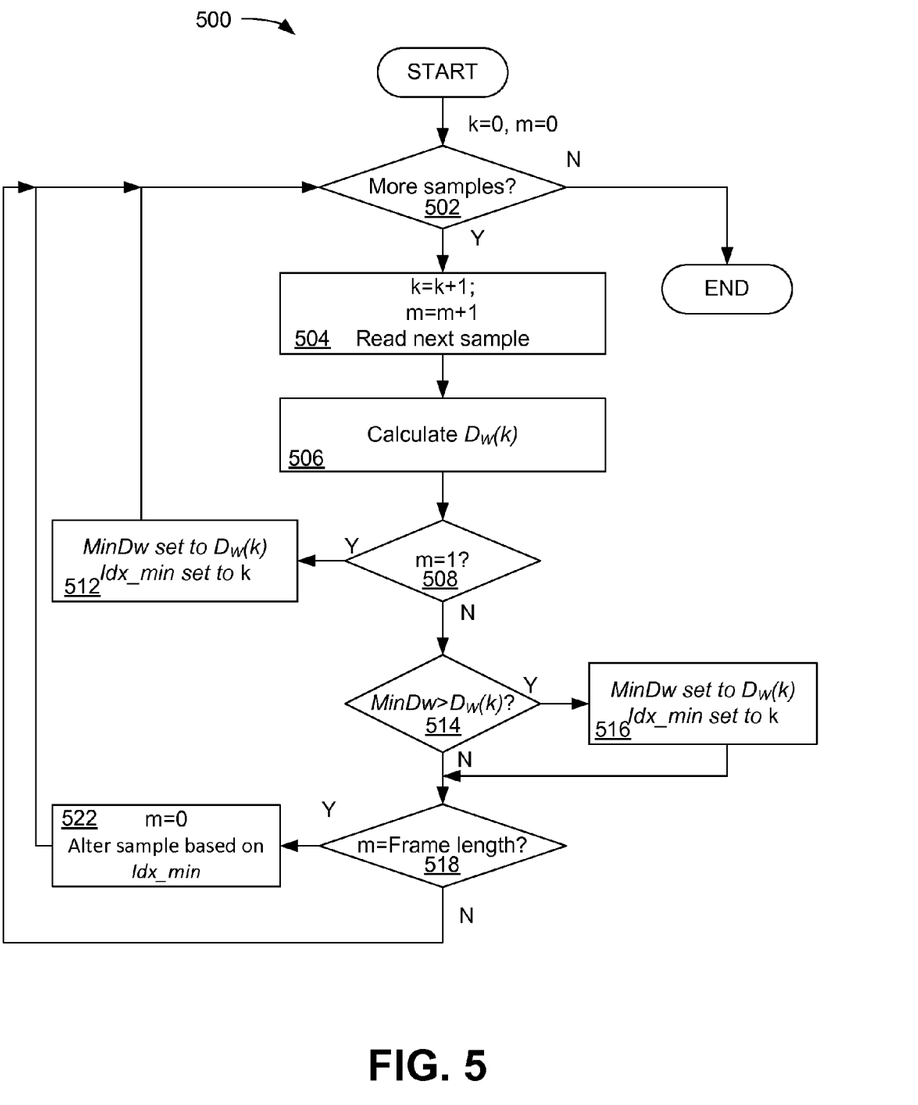
FIG. 5 is a flowchart describing an example of audio sample rate conversion by altering a sample at a location defined by a weighted sum of absolute derivatives.

FIG. 5 is a flowchart describing an example of audio sample rate conversion by altering a sample at a location defined by a weighted sum of absolute derivatives. In block 502, it is determined whether there is data to process. If there is data to process, the process proceeds to block 504. If it is determined in block 502 that there is no data to process, the process ends.

In block 504, the value of the counter k (317, FIG. 3) is incremented to k+1, the value of the counter m (319, FIG. 3) is incremented to m+1 and a next audio sample from the audio input signal $x(k)$ on connection 402 is read into the sample rate conversion element 400 (FIG. 4).

In block 506, the combined absolute derivative signal, $D_w(k)$, is computed. The combined absolute derivative signal, $D_w(k)$ can be obtained from any number of absolute derivatives, but in an embodiment, is typically chosen from between one (1) to three (3) absolute derivatives and may or may not include a first order derivative.

In block 508, it is determined whether the value of m is equal to 1. If it is determined in block 508 that the value of m equals 1, then the process proceeds to block 512, and the variable buffer location 323, MinDw, is initialized to the value of the combined absolute derivative signal, $D_w(k)$; and the value of the variable buffer location 321, Idx_min, is initialized to the value of the counter, k, which is the position of the first sample in the current frame. The process then proceeds to block 502.

If it is determined in block 508 that the value of m does not equal 1, then the process proceeds to block 514. In block 514 it is determined whether the term MinDw is greater than (>) the combined absolute derivative signal, $D_w(k)$ at position k. If it is determined in block 514 that the term MinDw is greater than (>) the combined absolute derivative signal, $D_w(k)$, then, in block 516, the buffer location 323, MinDw, is loaded with the combined absolute derivative signal, $D_w(k)$; and the value of the buffer location 321, Idx_min, is loaded with the value of the counter, k. The process then proceeds to block 518.

If it is determined in block 514 that the value of the term MinDw is not greater than (>) the combined absolute derivative signal, $D_w(k)$, then, in block 518 it is determined whether the value of the counter m equals the number of samples in the frame, which in this example is 79 samples.

If it is determined in block 518 that the value of the counter m does not equal the frame length, then the process proceeds to block 502.

If it determined in block 518 that the value of the counter m does equal the frame length, then the process proceeds to block 522. In block 522 the counter m is set to 0 and the sample at or near the location derived from the variable term Idx_min in the buffer location 321 is altered. A sample is added (for example, duplicated) if the input rate is less than the desired output rate (as in this example) and a sample is dropped if the input rate is higher than the desired output rate. After the operation in block 522 is completed, the process continues to block 502 and the next frame is processed.

Figure 6:
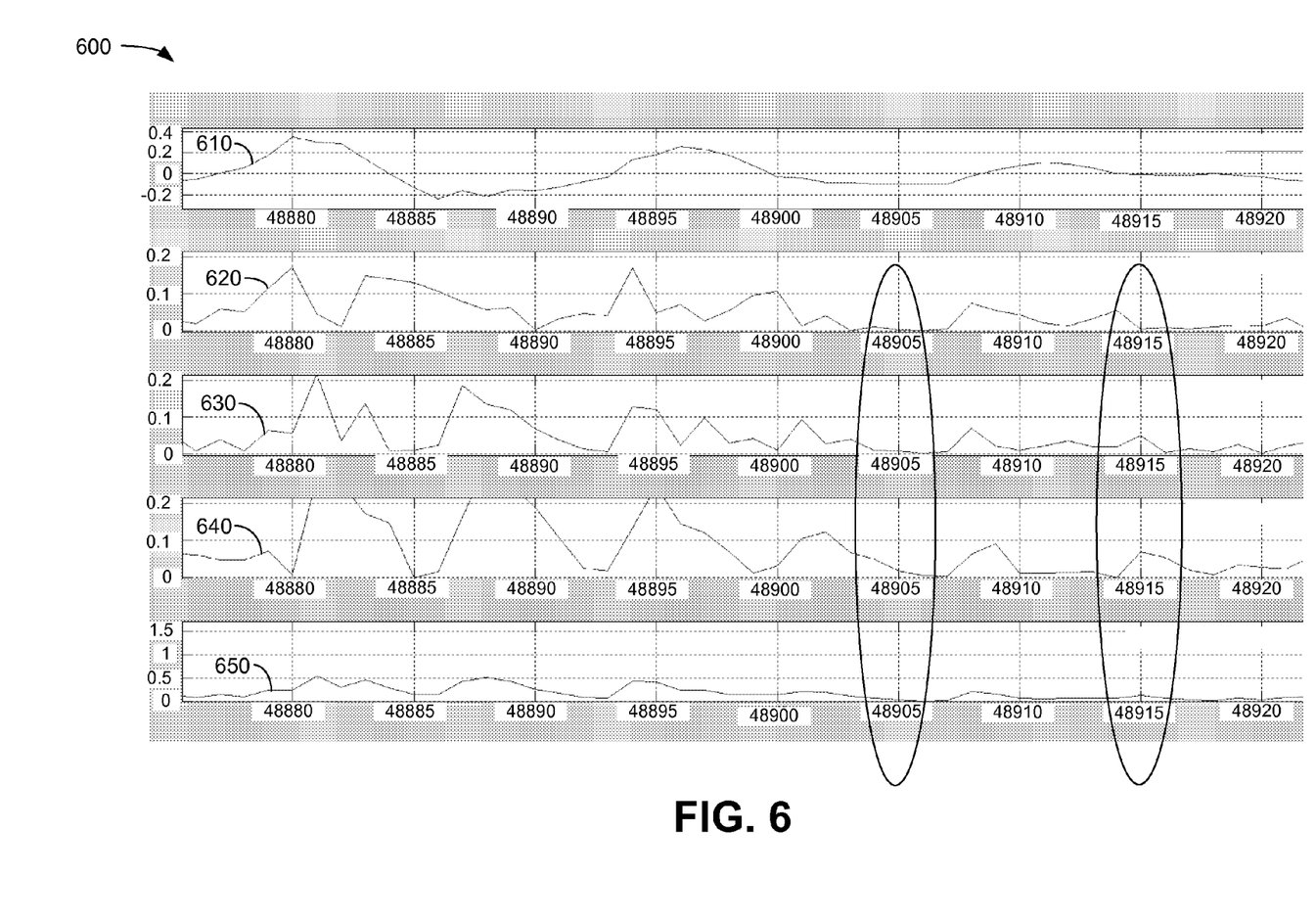
FIG. 6 is a graphical illustration showing a number of audio signal plots.

FIG. 6 is a graphical illustration showing a number of audio signal plots. The plots illustrate audio samples from a typical audio signal during a speech period. The vertical axis of each plot represents amplitude and the horizontal axis of each plot represents audio samples. The signal plot 610 represents the values of the audio signal at the input of the SRC 214 between approximately samples 48880 and 48920.

The signal plot 620 represents the absolute values of the first derivative of the audio signal represented in plot 610.

The signal plot 630 represents the absolute values of the second derivative of the audio signal represented in plot 610.

The signal plot 640 represents the absolute values of the third derivative of the audio signal represented in plot 610.

The signal plot 650 represents the weighted sum of the combined absolute values (e.g., the combined absolute derivative signal, $D_w(k)$) of the first derivative, second derivative and third derivative of the audio signal represented in plot 610.

Analyzing the three absolute derivative plots 620, 630 and 640 indicates that each derivative might have a different local minimum and it is assumed that they are all important. The relative importance is not necessary equal, which is the reason that weighting can be assigned to each derivative. The absolute derivatives are combined to find the best location at which to alter a sample. Dropping or adding a sample in a relatively smooth area results in a less audible occurrence than dropping or adding a sample in an area that is less smooth. For example, referring to points 48905 and 48915, the first derivative signal 620 at both points 48905 and 48915 have similar values, but the second derivative 630 and the third derivative 640 at point 48905 are both respectively lower in amplitude than they are at point 48915. Therefore, it would be less audibly apparent to drop (or add) a sample at or near point 48905 than at or near point 48915.

The plot 650 illustrates the function $D_w(k)$ and shows that a likely location to alter a sample occurs in the vicinity of point 48905, making the point 48905, or a point near 48905 a suitable location at which to alter a sample.

In view of the disclosure above, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the FIGS. which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and Blu-Ray disc where disks usually reproduce data magnetically, while discs reproduce data optically with lasers. Combinations of the above should also be included within the scope of computer-readable media.

Although selected aspects have been illustrated and described in detail, it will be understood that various substitutions and alterations may be made therein without departing from the spirit and scope of the present invention, as defined by the following claims.

What is claimed is:

1. A method for audio sample rate conversion, comprising:
   receiving an audio signal at a first rate, the audio signal having a fundamental frequency;
   determining absolute derivatives of the audio signal at the first rate including a first order derivative and at least one derivative higher than a first order derivative;
   generating a weighted sum of the absolute derivatives to arrive at a combined absolute derivative;
   analyzing the combined absolute derivative to locate a local minimum of the combined absolute derivative;
   selecting a location in the audio signal based on the local minimum of the combined absolute derivative; and
   altering at least one audio sample of the audio signal at the selected location to develop an audio signal at a second rate.

2. The method of claim 1, further comprising determining each absolute derivative according to $x^{(N)}(k)=x^{(N-1)}(k)-x^{(N-1)}(k-1)$, where N is the order of the derivative.

3. The method of claim 2, further comprising separately weighting each of the absolute derivatives.

4. The method of claim 3, wherein locating a local minimum of the combined absolute derivative comprises reviewing the combined absolute derivative over an audio frame.

5. The method of claim 4, wherein altering the at least one audio sample converts the audio signal at the first rate to the audio signal at the second rate.

6. The method of claim 1, wherein at least two absolute derivatives are derivatives other than a first order derivative.

7. The method of claim 1, wherein the altering further comprises adding at least one sample if the first rate is lower than the second rate.

8. The method of claim 1, wherein the altering further comprises dropping at least one sample if the first rate is higher than the second rate.

9. The method of claim 1, wherein the selected location is at the local minimum of the combined absolute derivative.

10. The method of claim 1, wherein the selected location is near the local minimum of the combined absolute derivative.

11. The method of claim 1, wherein the selected location is within a number of samples from the local minimum that is less than the order number of the absolute derivatives.

12. An apparatus for audio sample rate conversion, comprising:
   a memory for receiving an audio signal at a first rate, the audio signal having a fundamental frequency;
   logic for determining absolute derivatives of the audio signal at the first rate including a first order derivative and at least one derivative higher than a first order derivative;
   logic for generating a weighted sum of the absolute derivatives to arrive at a combined absolute derivative;
   logic for analyzing the combined absolute derivative to locate a local minimum;
   logic for selecting a location in the audio signal based on the local minimum of the combined absolute derivative; and
   logic for altering at least one audio sample of the audio signal at the selected location to develop an audio signal at a second rate; and a digital-to-analog converter for providing the audio signal at the second rate.

13. The apparatus of claim 12, wherein each absolute derivative is determined according to $x^{(N)}(k)=x^{(N-1)}(k)-x^{(N-1)}(k-1)$, where N is the order of the derivative.

14. The apparatus of claim 13, wherein each of the absolute derivatives is separately weighted.

15. The apparatus of claim 14, wherein locating a local minimum of the combined absolute derivative comprises reviewing the combined absolute derivative over an audio frame.

16. The apparatus of claim 15, wherein altering the at least one audio sample converts the audio signal at the first rate to the audio signal at the second rate.

17. The apparatus of claim 12, wherein at least two absolute derivatives are derivatives other than a first order derivative.

18. The apparatus of claim 12, wherein the altering further comprises adding at least one sample if the first rate is lower than the second rate.

19. The apparatus of claim 12, wherein the altering further comprises dropping at least one sample if the first rate is higher than the second rate.

20. The apparatus of claim 12, wherein the selected location is at the local minimum of the combined absolute derivative.

21. The apparatus of claim 12, wherein the selected location is near the local minimum of the combined absolute derivative.

22. The apparatus of claim 12, wherein the selected location is within a number of samples from the local minimum that is less than the order number of the absolute derivatives.

23. A method for audio sample rate conversion, comprising:
  receiving an audio signal at a first rate, the audio signal having a fundamental frequency;
  determining absolute derivatives of the audio signal at the first rate, the absolute derivatives comprising at least two derivatives higher other than a first order derivative;
  generating a weighted sum of the absolute derivatives to arrive at a combined absolute derivative;
  analyzing the combined absolute derivative to locate a local minimum of the combined absolute derivative;
  selecting a location in the audio signal based on the local minimum of the combined absolute derivative; and
  altering at least one audio sample of the audio signal at the selected location to develop an audio signal at a second rate.

24. The method of claim 23, further comprising determining each absolute derivative according to $x^{(N)}(k)=x^{(N-1)}(k)-x^{(N-1)}(k-1)$, where N is the order of the derivative.

25. The method of claim 24, further comprising separately weighting each of the absolute derivatives.

26. The method of claim 25, wherein locating a local minimum of the combined absolute derivative comprises reviewing the combined absolute derivative over an audio frame.

27. The method of claim 23, wherein the selected location is at the local minimum of the combined absolute derivative.

28. The method of claim 23, wherein the selected location is a near the local minimum of the combined absolute derivative.

29. The method of claim 23, wherein the selected location is within a number of samples from the local minimum that is less than the order number of the absolute derivatives.

30. An apparatus for audio sample rate conversion, comprising:
  a memory for receiving an audio signal at a first rate, the audio signal having a fundamental frequency;
  logic for receiving an audio signal at a first rate, the audio signal having a fundamental frequency;
  logic for determining absolute derivatives of the audio signal at the first rate, the absolute derivatives comprising at least two derivatives higher than a first order derivative;
  logic for generating a weighted sum of the absolute derivatives to arrive at a combined absolute derivative;
  logic for analyzing the combined absolute derivative to locate a local minimum of the combined absolute derivative;
  logic for selecting a location in the audio signal based on the local minimum of the combined absolute derivative; and
  logic for altering at least one audio sample of the audio signal at the selected location to develop an audio signal at a second rate.

31. The apparatus of claim 30, further comprising logic for determining each absolute derivative according to $x^{(N)}(k)=x^{(N-1)}(k)-x^{(N-1)}(k-1)$, where N is the order of the derivative.

32. The apparatus of claim 31, further comprising logic for separately weighting each of the absolute derivatives.

33. The apparatus of claim 32, wherein locating a local minimum of the combined absolute derivative comprises reviewing the combined absolute derivative over an audio frame.

34. The apparatus of claim 30, wherein the selected location is at the local minimum of the combined absolute derivative.

35. The apparatus of claim 30, wherein the selected location is a near the local minimum of the combined absolute derivative.

36. The apparatus of claim 30, wherein the selected location is within a number of samples from the local minimum that is less than the order number of the absolute derivatives.

* * * * *